US008178427B2

(12) United States Patent
Arena et al.

(10) Patent No.: US 8,178,427 B2
(45) Date of Patent: May 15, 2012

(54) EPITAXIAL METHODS FOR REDUCING SURFACE DISLOCATION DENSITY IN SEMICONDUCTOR MATERIALS

(75) Inventors: Chantal Arena, Mesa, AZ (US);
Laurent Clavelier, Grenoble (FR);
Marc Rabarot, Saint-Egreve (FR)

(73) Assignees: Commissariat a. l'Energie Atomique, Paris (FR); S.O.I. Tec Silicon on Insulator Technologies, S.A., Bernin (FR)

( * ) Notice: Subject to any disclaimer, the term of this patent is extended or adjusted under 35 U.S.C. 154(b) by 135 days.

(21) Appl. No.: 12/721,461

(22) Filed: Mar. 10, 2010

(65) Prior Publication Data

US 2010/0244197 A1    Sep. 30, 2010

Related U.S. Application Data

(60) Provisional application No. 61/165,290, filed on Mar. 31, 2009.

(51) Int. Cl.
*H01L 21/20* (2006.01)
(52) U.S. Cl. ............... 438/481; 438/483; 257/E21.097
(58) Field of Classification Search ........... 438/481, 438/498; 257/E21.097, E21.117
See application file for complete search history.

(56) References Cited

U.S. PATENT DOCUMENTS

| 6,015,979 A | 1/2000 | Sugiura |
| 6,051,849 A | 4/2000 | Davis et al. |
| 6,153,010 A | 11/2000 | Kiyoku et al. |
| 6,447,938 B1 | 9/2002 | Bianchi |
| 6,927,149 B2 * | 8/2005 | Sugahara et al. ............ 438/481 |
| 7,128,786 B2 | 10/2006 | Jurgensen et al. |
| 7,361,576 B2 | 4/2008 | Imer et al. |
| 7,399,684 B2 * | 7/2008 | Roycroft et al. ............ 438/478 |
| 2002/0005593 A1 | 1/2002 | Bouret-Courchesne |
| 2002/0043208 A1 | 4/2002 | Biwa et al. |
| 2002/0069817 A1 | 6/2002 | Mishra et al. |
| 2003/0180580 A1 | 9/2003 | Wada et al. |
| 2004/0067648 A1 | 4/2004 | Morita et al. |
| 2004/0150001 A1 | 8/2004 | Shchukin et al. |
| 2005/0037526 A1 | 2/2005 | Kamiyama et al. |
| 2005/0093099 A1 | 5/2005 | Koike et al. |
| 2005/0167692 A1 | 8/2005 | Ishida et al. |
| 2007/0026643 A1 | 2/2007 | Tadatomo et al. |
| 2007/0037308 A1 | 2/2007 | Okuyama et al. |
| 2007/0212803 A1 * | 9/2007 | Shibata ............ 438/22 |
| 2007/0259504 A1 | 11/2007 | Bour et al. |

(Continued)

FOREIGN PATENT DOCUMENTS

WO    2007068756    6/2007

(Continued)

OTHER PUBLICATIONS

Beaumont et al. "Epitaxial Lateral Overgrowth of GaN" Physica Status Solidi, vol. 227 No. 1 May 29, 2001 pp. 1-43. 43 pages.

(Continued)

*Primary Examiner* — Stephen W Smoot
(74) *Attorney, Agent, or Firm* — TraskBritt (57) ABSTRACT

The invention provides methods and structures for reducing surface dislocations of a semiconductor layer, and can be employed during the epitaxial growth of semiconductor structures and layers comprising III-nitride materials. Embodiments involve the formation of a plurality of dislocation pit plugs to prevent propagation of dislocations from an underlying layer of material into a following semiconductor layer of material.

20 Claims, 7 Drawing Sheets

U.S. PATENT DOCUMENTS

2007/0267722 A1 11/2007 Lochtefeld et al.
2008/0099781 A1 5/2008 Choi et al.

FOREIGN PATENT DOCUMENTS

WO 2008141324 A2 11/2008
WO 2008141324 A3 11/2008

OTHER PUBLICATIONS

Bohyama et al., "Freestanding GaN Substrate by Advanced Facet-Controlled Epitaxial Lateral Overgrowth Technique with Masing Side Facets" Japanese Journal of Applied Physics JJAP, vol. 44 No. 1 (2005) pp. 24-26. 3 pages.

Fang et al. "Reduction of Threading Dislocations in GaN Layers Using in situ Deposited Silicon Nitride Masks on AlN and GaN Nucleation Layers" Applied Physics Letters, vol. 84 No. 4, Jan. 26, 2004 pp. 484-486. 3 pages.

Fareed et al. "Vertically Faceted Lateral Overgrowth of GaN on SiC with Conducting Buffer Layers Using Pulsed Metalorganic Chemical Vapor Deposition" Applied Physics Letters, vol. 77 No. 15 Oct. 9, 2000 pp. 2343-2345. 3 pages.

Gibart, Pierre "Metal Organic Vapour Phase Epitaxy of GaN and Lateral Overgrowth" Reports on the Progress in Physics vol. 67 Apr. 7, 2004 pp. 667-715. 49 pages.

Haffouz et al. "The Effect of the Si/N Treatment of a Nitridated Sapphire Surface on the Growth Mode of GaN in Low-Pressure Metalorganic Vapor Phase Epitaxy" Applied Physics Letters vol. 73 No. 9 Aug. 31, 1998 pp. 1278-1280. 3 pages.

Iwaya et al., "Reduction of Etch Pit Density in Organometallic Vapor Phase Epitaxy-Grown GaN on Sapphire by Insertion of a Low-Temperature-Deposited Buffer Layer Between High-Temperature-Grown GaN" Japanese Journal of Applied Physics vol. 37 Part 2 No. 3B Mar. 15, 1998 pp. 316-318. 3 pages.

Lahréche et al. "Growth of High-Quality GaN by Low-Pressure Metal-Organic Vapour Phase Epitaxy (LP-MOVPE) From 3-D Islands and Lateral Overgrowth" vol. 205 Jun. 8, 1999 pp. 245-252. 8 pages.

Napierala et al. "Stress Control in GaN/Sapphire Templates for the Fabrication of Crack-Free Thick Layers" Journal of Crystal Growth vol. 289 Nov. 22, 2005 pp. 445-449. 5 pages.

Tanaka et al. "Anti-Surfactant in III-Nitride Epitaxy—Quantum Dot Formation and Dislocation Termination" Japanese Journal of Applied Physics vol. 39 Part 2 8B Aug. 15, 2000 pp. 831-834. 4 pages.

Zang et al., "Defect Reduction by Periodic SiNx Interlayers in Gallium Nitride Grown on Si (111)" Journal of Applied Physics vol. 101, 093502 Mar. 6, 2007. 4 pages.

French Search Report for FR0952241, dated Oct. 23, 2009.

* cited by examiner

EPITAXIAL METHODS FOR REDUCING SURFACE DISLOCATION DENSITY IN SEMICONDUCTOR MATERIALS

CLAIM OF PRIORITY

The present application for patent claims priority under 35 U.S.C. §119 to U.S. Provisional Patent Application Ser. No. 61/165,290, filed Mar. 31, 2009, the disclosure of which is hereby expressly incorporated herein by this reference in its entirety.

FIELD

The invention relates to methods and structures for reducing the surface dislocation density of a semiconductor material. Embodiments of the invention include methods for improving the crystal quality of a semiconductor structure, and structures fabricated utilizing these methods.

BACKGROUND

The quality of a semiconductor material can considerably influence the performance of a solid-state device produced from said material. Solid-state devices can suffer from inferior lifetimes and operating characteristics when the semiconductor material has an undesirable density of crystal defects such as, for example, dislocations.

Such problems have hindered the development of semiconductor materials and devices including gallium nitride (GaN), other Group III-nitrides (e.g., AlN, InN, GaInN) and other mixed nitrides (referred to herein as "III-nitrides") as well as certain Group III-V compounds; and of certain other compound materials (e.g., IV, II-VI materials) generally. For many of these materials, suitable and commercially useful substrates have limited availability and poor crystal quality. A suitable substrate closely matches the crystal properties of the target material to be grown. If these crystal properties do not closely match, the resulting material may have an unacceptable density of dislocations.

Specifically, in the case of GaN, crystal quality can be improved by pre-treating the growth substrates by, for example, nitridization and other chemical modifications, by growing thin, low temperature buffer layers of other III nitrides (e.g., AlN or GaN), by thermal annealing, and the like. Methods such as epitaxial lateral overgrowth (ELO) and its variants (PENDEO, FIELO, etc.) have proven successful in reducing dislocation density. However, these methods often utilize lithographically produced masking elements that often produce materials with a non-uniform distribution of surface dislocations, which may be undesirable in some applications. Alternative methods of reducing the number of dislocations and producing homogenous surface dislocation densities have utilized in-situ (or ex-situ) deposition methods to impede dislocation progression. Examples of such impeding methods are described in, for example, United States Patent Application Publication No. US2007/0259504, which published Nov. 8, 2007 and is entitled "Dislocation-Specific Lateral Epitaxial Overgrowth To Reduce Dislocation Density Of Nitride Films," Tanaka et al., Japanese Journal of Applied Physics, 39 L831 2000, and Zang et al., Journal of Applied Physics 101 093502 2007. In some instances, these methods may be employed with the addition of etchants to enhance surface dislocation dimensions.

There remains a need in the art for layers and crystals of semiconductor material (e.g., III-nitrides) of improved quality, and for methods of producing such layers and crystals of improved quality.

SUMMARY

The present invention provides systems and methods for fabricating semiconductor structures and, in particular, fabricating semiconductor structures comprising III-nitride materials. Methods of the invention fabricate semiconductor layers with improved crystal qualities (e.g., with fewer dislocations) in comparison to the state of the art. The invention also provides semiconductor structures fabricated by these methods.

In more detail, embodiments of the invention include providing a semiconductor layer having a primary semiconductor surface comprising a plurality of surface pits associated with emergent surface dislocations. The surface pits in the primary semiconductor layer can be produced by a number of methods.

In certain embodiments, the surface pits are produced by the emergence of dislocations at the primary semiconductor surface. In further embodiments, the plurality of surface pits may be produced (or at least enlarged) by etching the primary semiconductor surface under etch conditions that encourage etching at, or proximate to, the emergent surface dislocations and that discourages etching away from the emergent surface dislocations. Further embodiments can comprise etching an initial semiconductor surface under etch conditions that encourage etching at or proximate to the emergent surface dislocations and that discourages etching away from the emergent surface dislocations, and growing a semiconductor layer comprising the primary semiconductor surface on the initial semiconductor surface under epitaxial growth conditions that are selected to encourage opening of the surface pits and may also comprise the agglomeration of two or more surface pits at the primary surface.

Further embodiments mask a plurality of the emergent dislocations with caps, the caps being fabricated from a first masking layer, wherein the first masking layer can comprise one or more of silicon oxides, silicon nitrides or mixtures thereof. Each cap may extend at least partially into a surface pit of the plurality of surface pits. The masking of the surface pits can comprise depositing one or more amorphous materials on the primary semiconductor surface. Subsequent processes may remove those portions of the amorphous materials deposited on the primary semiconductor surface which are not masking the surface pits. Removing portions of the amorphous material may be performed utilizing methods such as chemical mechanical polishing and plasma etching.

Further embodiments of the invention remove a portion of the unmasked regions of the semiconductor layer to form a secondary semiconductor surface. Removing portions of the unmasked regions of the semiconductor layer may be performed utilizing plasma etching with chorine based etch chemistries.

Embodiments of the invention may also form a plurality of spacer structures from a second masking layer adjacent to the caps. The formation of such spacer structures may comprise, depositing one or more substantially conformal amorphous materials and anisotropically etching the one or more substantially conformal amorphous materials until the portions of the secondary semiconductor surface away from the dislocation are exposed. The second masking layer can comprise one or more of silicon oxides, silicon nitrides or mixtures thereof. The spacer structures can be located adjacent to the caps such that the caps and spacer structures together form a plurality of dislocation pit plugs. The dislocation pit plugs mask a lateral portion of the secondary semiconductor surface thereby substantially preventing further emergence of the underlying dislocations.

A following semiconductor layer can be grown from the secondary semiconductor surface over the plurality of dislocation plugs and hence over the associated dislocations. Growth over the dislocation plugs can utilize epitaxial growth conditions which promote lateral growth over the dislocation plugs, thereby producing a substantially continuous following semiconductor layer with fewer dislocations than the primary semiconductor layer. In certain embodiments of the invention the semiconductor layer and the following semiconductor layer comprise III-nitride materials.

Further embodiments of the invention provide structures and intermediate structures utilized for the reduction of dislocation density of a semiconductor layer. In greater detail, embodiments include a semiconductor structure comprising, a first semiconductor layer having an upper surface comprising a plurality of surface pits, the surface pits intersecting emergent dislocations in the first semiconductor layer. In further embodiments, two or more of the surface pits of the semiconductor structure may intercept one another to form an agglomerated pit region.

The semiconductor structure can further comprise a plurality of dislocation pit plugs, each dislocation pit plug masking at least one of the emergent dislocations. The plurality of dislocation plugs may comprise a first masking structure disposed at least partially within a surface pit of the plurality of surface pits and a second masking structure adjacent to the upper surface of the first semiconductor layer and adjacent to the first masking structure.

The first and second masking structures may comprise one or more amorphous materials from the group of silicon nitride, silicon oxides and mixtures thereof. In addition the first masking structure has an upper surface that extends above the upper surface of the first semiconductor layer. Further the second masking structure extends laterally from the first masking structure.

The semiconductor structure may additional include a following semiconductor layer cover the plurality of dislocation plugs wherein the following semiconductor layer has a lower density of surface dislocation than the first semiconductor layer. In embodiments of the invention at least one of the first semiconductor layer and the following semiconductor layer comprises a III-nitride material.

The term "conformal" such as "conformal material" or "conformal deposition" is used herein to refer to formation of a layer which has a substantially equal thickness throughout its extent and substantially preserves the topography of an underlying layer or structure upon which the conformal material was formed.

As used herein, the terms "upper" and "lower" refer to a location relative to a base or growth substrate. The term "upper" refers to a location that is distal to the substrate, while the term "lower" indicates proximity to the substrate.

As used herein, the term "anisotropically etching" refers to an etching process in which etched material is removed at a faster rate in one direction, and at a slower rate in another direction (e.g., etching faster in the vertical direction and slower in a transverse (horizontal) direction.

As used herein, the term "amorphous materials" refers to a material without substantial long range order in the position of the atoms of said material.

The term "III-nitride" is used herein to refer to any material predominantly comprised of one or more elements from group IIIA of the periodic table (B, Al, Ga, In, and Ti) and one or more elements from group VA of the periodic table (N, P, As, Sb, and Bi).

The term "substantially" is used herein to refer to a result that is complete except for the deficiencies normally expected in the art. For example, a conformal layer (or a continuous layer) cannot routinely be expected to be perfectly conformal (or continuous) across macroscopic dimensions. However, a conformal (or continuous) layer can routinely be expected to be "substantially conformal" (or "substantially continuous") across macroscopic dimensions, where the imperfection are those expected in the art for the processing conditions, the material quality sought, and so forth.

Headings are used herein for clarity only and without any intended limitation. A number of references are cited herein, the entire disclosures of each of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be more fully understood by reference to the following detailed description of the embodiments of the invention, illustrative examples of specific embodiments of the invention and the appended figures in which.

FIGS.

DETAILED DESCRIPTION

Although the following description is predominantly directed towards embodiments including methods and structures for reducing dislocation density in semiconductor layers, surfaces and materials comprising III-nitrides, it should be understood that embodiments of the invention are not limited to such materials. Therefore, without limitation to material composition, embodiments of the invention may be used to hinder (and, in some embodiments, at least substantially prevent) dislocations present at a primary semiconductor surface of a semiconductor layer from resulting in (e.g., causing) dislocations or other defects in a following layer of semiconductor material, such that the quality of the following layer of semiconductor material may be improved.

One example embodiment of the invention is described below with reference to FIGS. 1A-1J. These figures are simplified, schematic representations of structures that may be formed during embodiments of methods of the present invention, and are not drawn to scale.

Figure 1A:
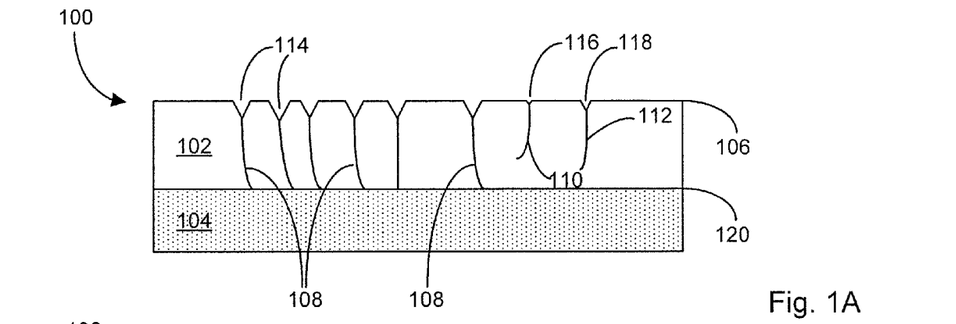
FIGS. 1A-1I schematically illustrate an embodiment of the invention.

FIG. 1A illustrates an intermediate semiconductor structure 100 that comprises a semiconductor layer 102 upon a base substrate 104. The semiconductor layer may comprise a crystal of semiconductor material such as, for example, a III-nitride material (e.g., GaN, InGaN, AlGaN etc.). The semiconductor layer 102 has a primary surface 106. A plurality of dislocations 108, 110 and 112 in the crystal structure of the semiconductor layer 102 intersect the primary surface 106. Surface pits 114, 116 and 118 may be present in the primary surface 106 at the intersections with the respective dislocations 108, 110 and 112. The semiconductor layer 102 can be provided on base substrate 104 by methods such as epitaxial deposition, layer transfer from a donor material, etc.

In embodiments in which the III-nitride material is provided by epitaxial growth, III-nitride semiconductor layer 102 can be epitaxially deposited on base substrate 104 via methods such as molecular beam epitaxy (MBE), metallorganic chemical vapor deposition (MOCVD), hydride vapor phase epitaxy (HYPE), etc. In embodiments involving the epitaxial growth of III-nitride materials, the base substrate may comprise a homogenous structure (e.g., comprising a single material such as sapphire ($Al_2O_3$), silicon carbide (SiC), silicon (Si), gallium arsenide (GaAs)) or alternatively may comprise a heterogeneous structure (e.g., comprising two or more materials such as GaN-on-sapphire, SiC-on-sapphire, GaAs-on-Si, etc.).

When utilizing a base substrate 104 having average crystalline properties that do not match those of the semiconductor layer 102 (e.g., mismatches in lattice parameters, thermal expansion coefficients etc), a number of defects such as dislocations can appear in the material of semiconductor layer 102. In FIG. 1A a number of dislocations 108 are illustrated as originating at interface 120 between semiconductor layer 102 and base substrate 104 due, for example, to crystalline lattice mismatch between the base substrate 104 and the semiconductor layer 102. Dislocations 108 that form at interface 120 may propagate through the semiconductor layer 102 to emerge at and intersect primary surface 106, and may result in the formation of surface pits 114.

Additional dislocations, such as dislocations 110 and 112, may form at a location within the bulk of semiconductor layer 102. These dislocations 110 and 112 also may propagate through the semiconductor layer 102 to emerge at and intersect primary surface 106, and may result in the formation of surface pits 116 and 118. As illustrated in FIG. 1A, the volume of the pits 114, 116 and 118 in the primary surface 106 of the semiconductor layer 102 (i.e., the volume of open space below the primary surface 106 at the intersections between the primary surface 106 and the dislocations 108, 110 and 112) may not be equal for each of the pits 114, 116 and 118. As shown in FIG. 1A, the volume of surface pits 114 (produced by dislocations 108) may be greater than the volume of surface pit 118 (produced by dislocation 112), and the volume of surface pit 116 (produced by dislocation 110) may be less than the volumes of surface pits 114 and 118. The volume of each surface pit may be at least partially dependent on the nature of the dislocation (i.e., type, strain, Burgers vector, etc.) that results in the formation of the respective surface pit.

Figure 1B:
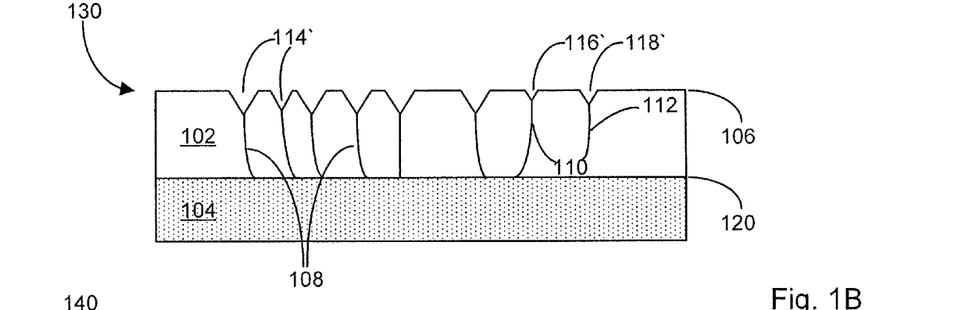

In some embodiments of the invention, it may be advantageous to increase the volumes of the surface pits 114, 116, 118 in the primary surface 106 produced by the dislocations 108, 110, 112. Therefore, FIG. 1B schematically illustrates an intermediate semiconductor structure 130 formed by processing intermediate structure 100 of FIG. 1A to increase the volumes of the surface pits 114, 116, 118.

Many methods are known in the art for increasing the volumes of surface pits 114, 116, 118, or the extent to which dislocations intersect the primary surface 106 of the semiconductor layer 102. Such processes are commonly referred to as "decoration" processes, as they assist in revealing the defects present at (and, hence, decorate) the primary surface 106 of the semiconductor layer 102. Primary surface 106 can be etched under etching conditions so that the material of semiconductor layer 102 is removed primarily or exclusively at or in the vicinity of surface dislocations, but is not significantly removed, if at all, from the areas of the primary surface 106 that are free of dislocations. Thus, upon such processes, the surface pits 114, 116, 118 in the primary surface 106 of structure 100 (FIG. 1A) are enhanced (e.g., enlarged) to form surface pits 114', 116' and 118' in the primary semiconductor surface 106 of the intermediate structure 130 of FIG. 1B.

Many routine etching solutions (etchants) are known to etch surfaces preferentially in regions of dislocations, and less "powerful" versions of these etching solutions can be used for the dislocation etching step. For example, the etching solutions may be, for example, less acidic, less basic, less oxidizing, or the like, than their usual forms. In the case of Si, etchants useful for defect etching include, for example, the Secco, or the Sirtl, or the Wright, or the Seiter etchants. Similar etchants have been developed for other semiconductor materials.

In embodiments in which semiconductor layer 102 comprises a III-nitride material such as, for example, GaN, the primary surface 106 may be decorated (i.e., selectively etched) utilizing any of a number of etch chemistries such as halogens (hydrogen fluoride, hydrogen chloride, etc.), potassium hydroxide, sodium hydroxide and phosphoric acid. In some embodiments, an in-situ decoration etch process may be employed such as, for example, the in-situ etch decoration processes employing silane gas mixtures at temperatures above approximately 800° C. within an epitaxial deposition reactor, such as a reactor that maybe used to produce semiconductor layer 102 and other following (i.e., subsequently deposited) semiconductor layers.

The nature of the emergent dislocation 108, 110, 112 may also affect the degree of decoration etching that takes place proximate the emergent dislocation 108, 110, 112 (i.e., the extent to which the surface pits 114, 116, 118 are enlarged). See, for example, Physica Status Solidi (B) 228 395 (2001). Accordingly, for example, surface pits 114' may be enlarged relative to surface pits 114 by a factor that is relatively greater than a factor by which the surface pits 118' may be enlarged relative to surface pits 118. Similarly, surface pits 118' may be enlarged relative to surface pits 118 by a factor that is relatively greater than a factor by which the surface pits 116' are enlarged relative to surface pits 116. The effectiveness of the decoration method in increasing the volume of any pit 114, 116, 118 may be dependent on the nature of the respective pit 114, 116, 118 (e.g., type, strain, Burgers vector etc.). It is noted that the size of the pits 114, 116, 118 and the pits 114', 116', 118' relative to the semiconductor layer 102 have been exaggerated in the figures for purposes of illustration. The degree to which the pits 114, 116, 118 are enlarged to form the pits 114', 116', 118' has also been exaggerated for purposes of illustration.

Embodiments of the present invention may be used to mask a plurality of surface pits (e.g., the surface pits 114, 116, 118 of FIG. 1A or the surface pits 114', 116', 118' of FIG. 1B) on the primary surface 106 of the semiconductor layer 102. The masking (e.g., the occlusion, filling, plugging, etc.) of the surface pits can be provided by a number of methods.

Figure 1C:
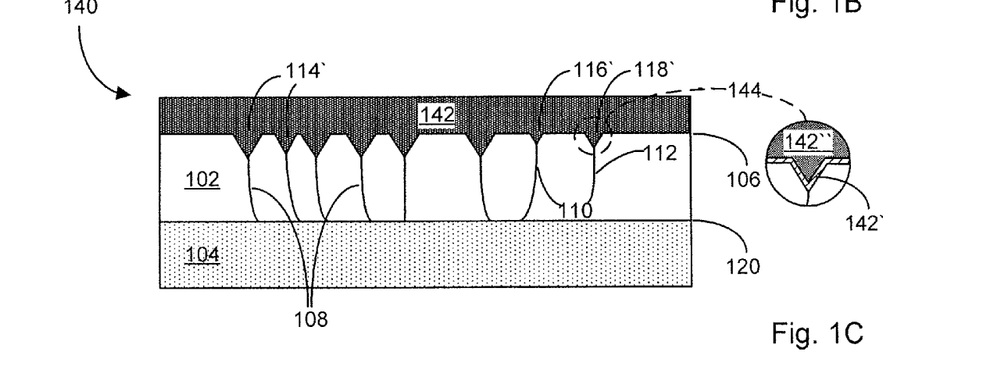

FIG. 1C illustrates an intermediate semiconductor structure 140 that includes a first masking layer 142 which has been formed on primary surface 106 such that the surface pits 114', 116' and 118' have been masked. First masking layer 142 may comprise one or more materials. For example, as illustrated in inset 144 of FIG. 1C, an initial masking material 142' may be provided (e.g., deposited) on primary semiconductor surface 106, and a subsequent material 142" may be provided (e.g., deposited) on the initial masking material 142' to provide the first masking layer 142 with a sufficient thickness to partially or fully mask surface pits 114', 116' and 118'.

The first masking layer 142 may be formed by depositing, or otherwise placing (e.g., by a mechanical process) the first masking layer 142 over the semiconductor layer 102 so as to occlude and mask the at least substantially all of the surface pits 114', 116', 118'. The first masking layer 142 may at least substantially fill the pits 114', 116', 118' and provide a "cap" of masking material (a material of the first masking layer 142) within the surface pits 114', 116', 118' at and below the plane of the primary surface 106. In some embodiments, the first masking layer 142 may conform to the primary surface 106 of the semiconductor layer 102, such that the surface of the first masking layer 142 opposite the semiconductor layer 102 includes regions having a gently scooped-out shape located over the pits 114', 116', 118'.

Masking materials utilized to form the first masking layer 142 can be selected to promote the overgrowth of a following (i.e., subsequently deposited) semiconductor layer. The material of such a following semiconductor layer should not readily nucleate on, or grow directly on, the exposed material of the first masking layer 142 (at least in comparison to the material of the semiconductor layer 102), so that the following semiconductor layer epitaxially overgrows at least substantially all of the masked dislocations 108, 110, 112. For example, in embodiments in which the semiconductor layer 102 comprises a III-nitride material, the first masking layer 142 may comprise amorphous materials such as silicon nitrides, silicon oxides and mixtures thereof.

A portion of the first masking layer 142 may be removed to re-expose dislocation free portions of primary surface 106 whilst leaving portions of the first masking material 142 within the surface pits 114', 116', 118', thereby retaining a plurality of first masking structures (e.g., caps) within the surface pits 114', 116', 118', hence masking and capping the dislocations 108, 110, 112 of semiconductor layer 102 that intersect the primary surface 106.

Figure 1D:
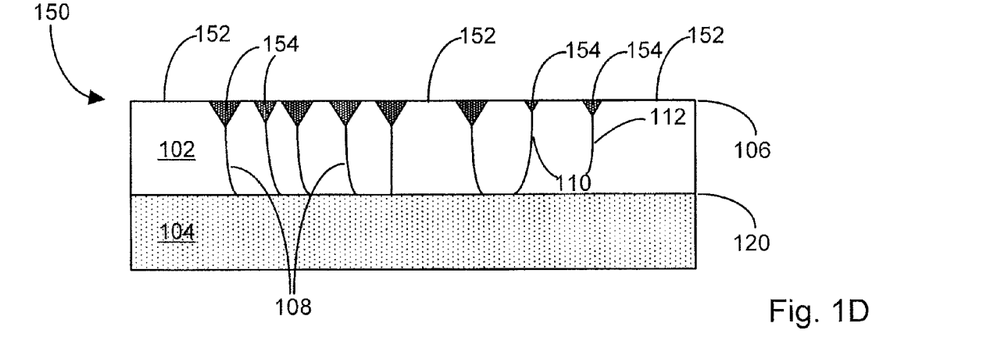

FIG. 1D schematically illustrates intermediate semiconductor structure 150, which may be formed from intermediate semiconductor 140 by removing a portion of the first masking layer 142. The removal of a portion of the first masking layer 142 may be performed in such a manner that portions of the amorphous materials of the first masking layer 142 not masking the surface pits 114', 116', 118' are substantially removed. A majority of the surface pits 114', 116', 118' remain masked (e.g., capped) with masking material after removal of a portion of the first masking layer 142. The remaining masking material of the first masking layer 142 may be at least substantially disposed within the surface pits 114', 116', 118.

In some embodiments, a chemical mechanical polishing (CMP) process may be used to remove portions of the amorphous masking materials deposited over the primary surface 106. In additional embodiments, an etching process such as, for example, a dry plasma etching process (e.g., reactive ion etching (RIE), inductively coupled plasma (ICP) etching, etc.) or a selective wet etching process may be used to remove portions of the amorphous masking materials deposited over the primary surface 106.

The removal of a portion of the first masking layer 142 may be performed utilizing conditions that produce a planarized (i.e., at least substantially planar) surface. As shown in FIG. 1D, the resulting surface comprises regions 152 of material of the semiconductor layer 102 that are substantially free of dislocations, as well as caps 154 that comprise remaining portions of the masking material of the first masking layer 142. The caps 154 mask the surface pits 114', 116', 118' over the dislocations 108, 110, 112.

Figure 1E:
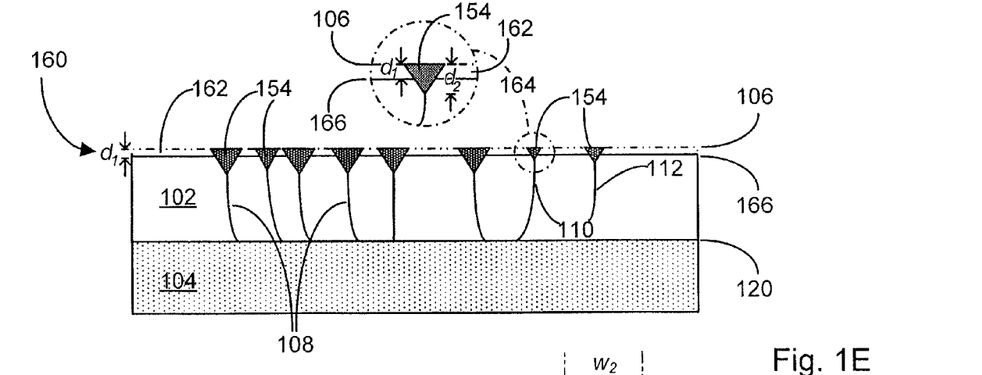

A portion of the unmasked regions of the semiconductor layer 102 may be removed whilst substantially preserving the caps 154 within the plurality of surface pits 114', 116', 118'. FIG. 1E therefore schematically illustrates an intermediate semiconductor structure 160 illustrating in phantom a region 162 of the semiconductor layer 102 that has been removed from the structure 150 of FIG. 1D. Inset 164 in FIG. 1E shows a more detailed view of the upper surface region of intermediate structure 160. The thickness of the region 162 removed from the semiconductor layer 102 is illustrated as being depth $d_1$ in FIG. 1E. In some embodiments of the invention, this depth $d_1$ is less than the depth $d_2$ of the caps 154. In other words, the etch depth of the etching process used to remove the region 162 may be less than depth $d_2$ to prevent the caps 154 from being under etched, which might result in their unintentional removal and, hence, re-exposure of the associated dislocations 108, 110, 112.

The etch process for removing the region 162 of the semiconductor layer 102 can be selective, such that the semiconductor layer 102 is removed preferentially to the caps 154. Therefore, etch processes and chemistries utilized for the removal of a portion of semiconductor layer 102 to produce secondary surface 166 should not etch in any significant manner the caps 154. Such selective etches are well known in the art. For example, both selective dry (e.g., plasma based) and wet chemistries (e.g., acid or alkali based) are known for producing a high degree of selectivity between the material(s) of the caps 154 and that of semiconductor layer 102. For example, if the semiconductor material of semiconductor layer 120 comprises a III-nitride material, such as GaN, and the masking material of the first mask layer 142 (and, hence, the caps 154) comprises a silicon dioxide material, a silicon nitride material, or a layered structure of both materials, the GaN can be selectively removed over the silicon dioxide/silicon nitride by plasma etching (e.g., by RIE, ICP, etc.) in a chlorine based gas chemistry, such as chlorine ($Cl_2$) and silicon tetrachloride ($SiCl_4$), or a combination thereof. The chlorine based gas chemistry is capable of producing a significantly greater etch rate in GaN compared with that of silicon dioxide/silicon nitride materials under appropriate etch conditions.

Upon removing of the region 162 of the semiconductor layer 102, a secondary surface 166 of the semiconductor layer 102 is revealed, and the upper surfaces of the plurality of caps 154 extend above the secondary surface 166 of the semiconductor layer 102. The extension of the caps 154 above the secondary surface 166 may have an approximate height of $d_1$.

Figure 1F:
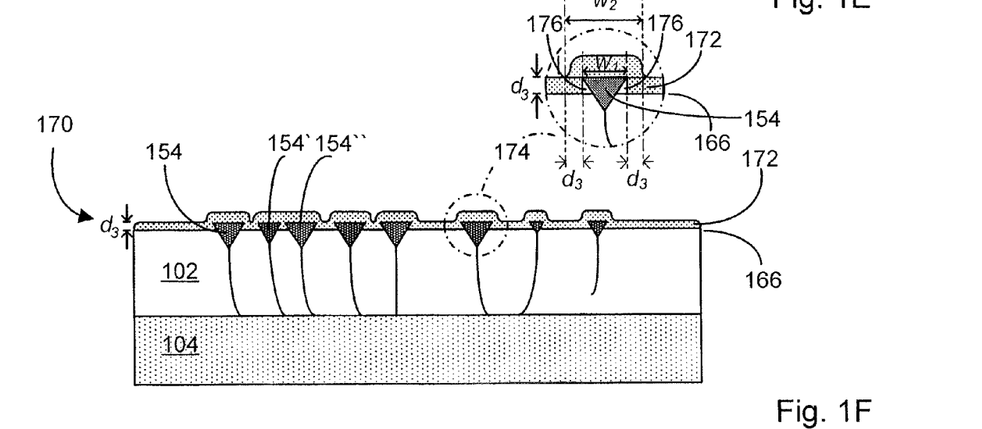

A second masking layer may be deposited over the caps 154 and the secondary surface 166 of the semiconductor layer 102. FIG. 1F, therefore schematically illustrates an intermediate semiconductor structure 170, which comprises the intermediate structure 160 of FIG. 1E with a second masking layer 172. As with the first masking layer 142, second masking layer 172 may comprise one or more materials and may be produced from amorphous materials. The material of the second masking layer 172 may encourage lateral overgrowth of a following semiconductor layer. In other words, the second masking layer 172 may comprise a material upon which the following semiconductor layer does not readily nucleate. Likewise, the second masking layer 172 may be formed by deposition or mechanical adhesion to intermediate semiconductor structure 160.

In some embodiments, second masking layer 172 may be deposited in such a manner that the deposited second mask layer 172 is substantially conformal to the underlying surface upon which it is deposited. The surface upon which the second masking layer 172 is to be deposited comprises the secondary surface 166 with a plurality of caps 154 extending up from the secondary semiconductor surface 166, as seen in intermediate structure 160 of FIG. 1E. The substantially conformal film may have a thickness that is substantially uniform throughout the extent of the second masking layer 172, as seen in FIG. 1F, in which the thickness of the second masking layer $d_3$ is substantially maintained through out the layer. In other words, the material of the second masking layer 172 may be deposited in such a manner as to substantially preserve the topography of the underlying surface. It should be noted that such a conformal deposition may exhibit some variation in thickness at the edges, steps and other features of the underlying surface.

Inset illustration 174 of FIG. 1F shows an expanded view of the conformal coating of the second masking layer 172 deposited over the underlying surface, which comprises an illustrative cap 154 and secondary semiconductor surface 166. The substantially conformal second masking layer 172 has thickness $d_3$, and the thickness of the second masking layer 172 is preserved throughout the layer. The upper portion of cap 154 has a maximum width $W_1$. As the overlying second masking layer 172 is substantially conformal to the topography of the underlying surface, the width of the portion of the second masking layer 172 overlying the cap 154 is somewhat greater than that of the cap 154, and has a maximum width $W_2$ shown in inset 174. The additional width may be approximately equal to twice the thickness of the second masking layer 172, due to deposition of the second masking layer 172 on both sides of the underlying cap 154. It should be noted that, in some embodiments, a portion of the semiconductor material of the semiconductor layer 102 may remain in the vicinity of the cap 154, as shown by portions 176. These portions 154 may remain due to the nature of the etch step used to remove the region 162 of the semiconductor layer 102, and the geometry of the cap 154.

In addition, note that caps 154' and 154" illustrated in FIG. 1F are sufficiently proximate to each other that the topography of the second masking layer 172 is unable to define two separate features, as seen by the topography of the second masking layer 172 overlying the caps 154' and 154". In other words, the second masking layer 172 extends over the caps 154' and 154" as if they were a single larger cap 154, rather than two smaller separate and isolated caps 154' and 154".

In some embodiments of the invention, the second masking layer 172 may comprise silicon oxides, silicon nitrides, or mixtures thereof. When semiconductor layer 102 comprises a III-nitride, the material of the second masking layer 172 may comprise a silicon nitride, which can be deposited by CVD processes, such as low-pressure chemical vapor deposition (LPCVD), such processes are well known in the art for producing an amorphous layer that is substantially conformal to the underlying surface topography.

Figure 1G:
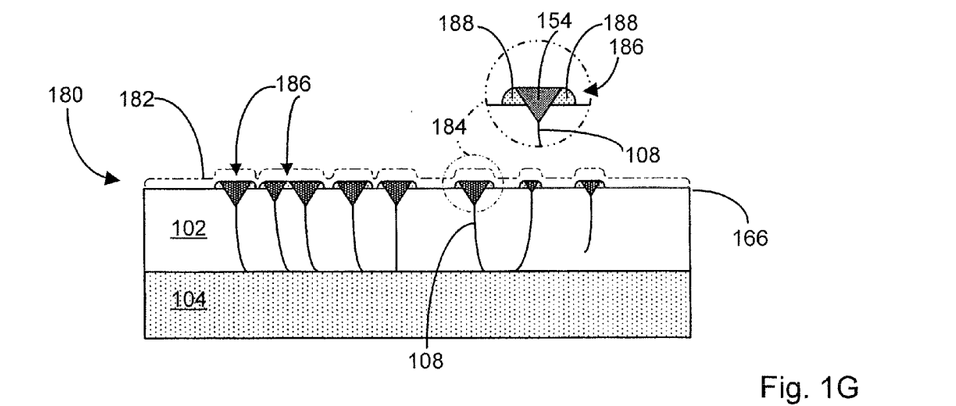

FIG. 1G schematically illustrates an intermediate semiconductor structure 180 that may be formed from the intermediate semiconductor structure 170 of FIG. 1F by removing portions of the second masking layer 172. As shown in inset 184 of FIG. 1G, portions of the second masking layer 172 may be removed to form a plurality of spacer structures 188 (second masking structures) which, together with the plurality of caps 154 (first masking structures) form a plurality of dislocation pit plugs 186. Portions of the second masking layer 172 are removed; thereby exposing portions of the secondary semiconductor surface 166 away from the dislocation pit plugs 188. The plurality of spacer structures 188, in conjunction with the plurality of caps 154, form a plurality of dislocation pit plugs 186 that may be used to substantially prevent further propagation of dislocations into subsequent following semiconductor layers (e.g., into further III-nitride material grown over the semiconductor layer 102).

Phantom surface 182 designates the original surface of the second masking layer 172 prior to etching, and inset 184 shows an expanded view of one dislocation pit plug 186 produced by etching portions of the second masking layer 172. Portions of the second masking layer 172 can be removed utilizing dry chemical etching. In some embodiments of the invention, portions of the second masking layer 172 can be removed by plasma etching processes, such as RIE and ICP. The plasma etch process parameters can be selected such that the material of the second masking layer 172 is etched in a more anisotropic manner. For example, etching may be more preferential in one direction, such as the vertical direction, relative to another direction, such as the horizontal direction. In other words, the anisotropic etch process may be selected such that the etch rate in the vertical direction is greater than the etch rate in the horizontal direction. In embodiments in which such an anistropic vertical etch mode is employed, the original surface topography of second masking layer 172 (i.e., shown as phantom surface 182 in FIG. 1F) may be substantially preserved in the post anisotropic etching structure. In other words, the material of the second masking layer 172 may be conformably removed. Anisotropic plasma etching can be produced by methods including choice of gas chemistries, decreasing the chemical nature of the etchant and increasing the kinetic nature of the etchant by, for example, decreasing chamber pressure, increasing electrical platen bias, etc.

The anistropic etch process may be used to produce a plurality of spacer structures 188. As previously mentioned, the spacer structures 188 combine with caps 154 to produce dislocation pit plugs 186. Each dislocation pit plug 186 has a central masking structure comprising cap 154 (which is a portion of the first masking layer 142). A portion of the structure of the cap 154 is located within a surface pit, and an emergent dislocation 108 may extend to the apex of the pit. The cap 154 masks and occludes the emergent dislocation 108. However, in addition to caps 154, the dislocation pit plugs 186 further comprise the spacer structures 188, which are portions of the second masking layer 172 disposed adjacent to and encircling the caps 154. The spacer structures 188 have a width substantially equal to $d_3$, as shown in the inset 174 of FIG. 1F. The spacer structures 188 extend laterally from the caps 154 and further assist in masking dislocations 108, and thereby may be used to prevent dislocations 108 from propagating into a following semiconductor layer grown in subsequent processes.

Figure 1H:
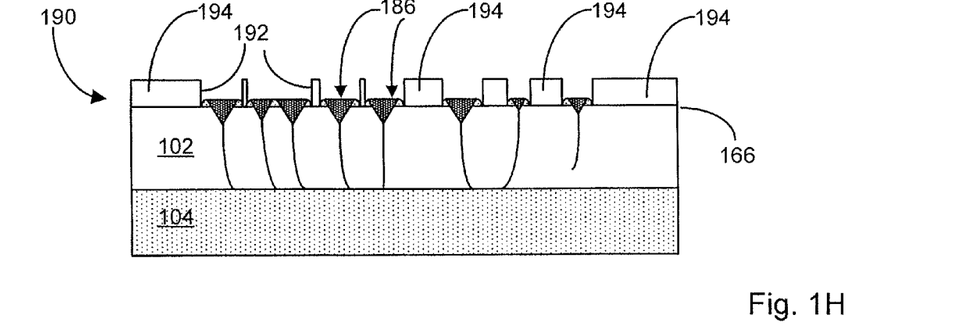
Figure 1I:
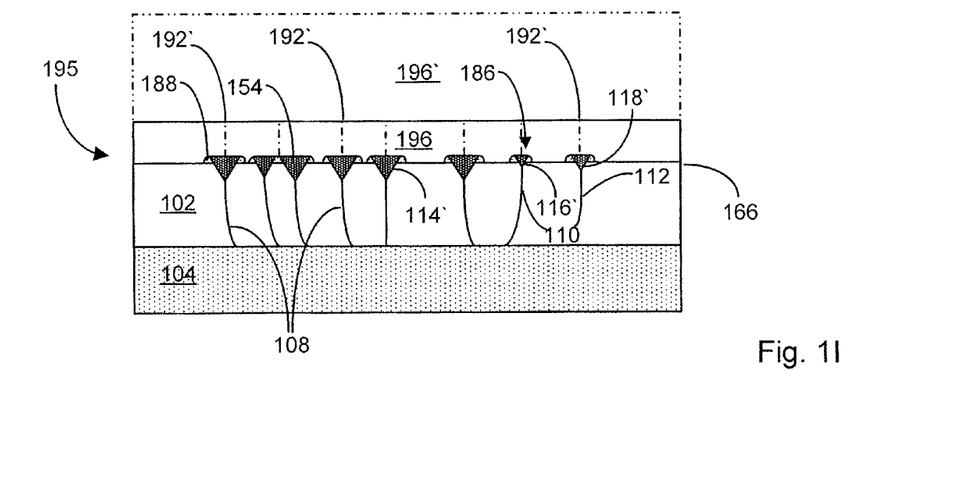

In subsequent stages of embodiments of the invention the exposed portions of secondary surface 166 of the semiconductor layer 102, which are substantially free of dislocations, are utilized as seed crystals for further material growth of a following semiconductor layer. The following semiconductor layer nucleates from the exposed, dislocation free portions of the secondary surface 166 and proceeds to grow up and laterally over the plurality of dislocation pit plugs 186 and the associated underlying dislocations 108. Therefore, at least substantially all of the dislocations may be terminated by the dislocation pit plugs 186, and the dislocations may be prevented from propagating into the following semiconductor layer. As a result, the following semiconductor layer may have a reduced surface dislocation density in comparison to that of the primary surface 106 (FIGS. 1A-1C). FIGS. 1H and 1I, illustrate the growth of a following semiconductor layer.

FIG. 1H schematically illustrates an intermediate semiconductor structure 190 and demonstrates the initial stages of growth of a following semiconductor layer. Initial growth proceeds in more of a vertical direction from the dislocation free portions of the secondary surface 166. In other embodiments, initial growth may proceed in more of a lateral direction, or generally isotropically (i.e., at the same rate in all directions). Methods are known in the art for controlling the extent of lateral versus vertical growth of various materials including, for example, GaN. See, for example, U.S. Pat. Nos. 6,015,979 issued Jan. 12, 2000 to Sugiura et al., 6,051,849 issued Apr. 18, 2000 to Davis et al., and 6,153,010 issued Nov. 28, 2000 to Kiyoku et al.).

Therefore, in some embodiments, the growth can be initiated from the substantially dislocation free portions of secondary surface 166 of semiconductor layer 102 in a more vertical growth mode, and, upon obtaining a desired vertical height, the growth mode may be switched to a more lateral growth mode. In other embodiments, a lateral growth mode may be initially utilized. In some embodiments, an initial vertical growth mode may be employed to provide crystal side facets 192 from which lateral growth can then be initiated. In addition, growth conditions can be selected to yield a growth mode incorporating both lateral and vertical components. Conditions suitable for obtaining vertical and lateral growth modes are known in the art.

In further detail, FIG. 1H illustrates an early stage in the lateral growth from exposed dislocation free portions of secondary surface 166. The lateral growth regions 194, which comprise a semiconductor material (e.g., GaN), originate or nucleate from exposed dislocation free portions of the secondary surface 166 and include lateral crystal growth facets 192. It should be noted that little or no nucleation (i.e., origination of crystal growth) may take place on dislocation pit plugs 186, as the materials of the dislocation pit plugs 186 may be selected to prevent nucleation from these regions.

FIG. 1I illustrates intermediate structure 195 wherein the lateral growth process is at a stage of coalescence at which stage the lateral growth regions 194 coalesce together to form a substantially continuous following semiconductor layer 196, which may comprise a III-nitride material such as GaN. The lateral crystal growth facets 192 (FIG. 1H) may provide the fronts along which growth occurs, such that the lateral crystal growth facets 192 converge and merge at locations 192' of intermediate structure 195 to form a single coalesced following semiconductor layer 196. The spatial arrangement, size and structure of the dislocation free portions of secondary surface 166 are preferably selected so as to promote a high quality lateral growth process, e.g., distributed and spaced such as to prevent crystal tilt/twist prior to coalescence thereby substantially preventing further defect formation.

Therefore semiconductor structure 195 (of FIG. 1I) provides a relatively high-quality (e.g., relatively low density of dislocations) template structure that may be used for further growth of semiconductor material thereover, such as III-nitride materials, which also may be of relatively high quality. Phantom area 196' of FIG. 1I demonstrates the further growth of the following semiconductor layer. In certain embodiments of the invention, the following semiconductor layer may be grown in a more vertical mode, which promotes the thickening of the following semiconductor layer to a desired thickness. Preferential vertical growth of material, as known in the art, can be performed by selectively varying epitaxial growth parameters.

The following semiconductor layer, in some embodiments, comprises a III-nitride, such as GaN. Therefore, embodiments of the invention are capable of producing a continuous layer of high quality GaN with an improved dislocation density. The thickness of the following semiconductor layer 196' may be less than approximately 1 μm, or up to approximately 100 μm, up to approximately 500 μm, or even up to approximately 1000 μm.

Resulting continuous following semiconductor layer 196' may be employed for the fabrication of electronic components, photovoltaic components, optic components, or optoelectronic components, etc. In alternative embodiments of the invention, either a portion or the entire continuous semiconductor layer can be transferred from intermediate structure 195 for producing free standing or composite type substrates. Transfer processes can proceed with detachment of a portion of the following semiconductor layer 196' and may also include bonding techniques.

Additional embodiments of the invention are now described, with reference to the simplified, schematic illustrations of FIGS. 2A-J. Many of the processes and structures involved in these additional embodiments are related to those previously described, and, therefore, the following description will focus primarily on the different aspects of the additional embodiments of the invention.

Briefly, the additional embodiments of the invention proceed as previously described with the addition of further processing stages to further increase the initial size (or opening) of the surface pits in the primary semiconductor surface of the semiconductor layer by further growth processes. Such additional processes may take place prior to cap and spacer structure formation and overgrowth. Furthermore, additional stages can not only increase the initial size of single surface pits, but may also encourage the agglomeration of two or more surface pits to further increase the size (i.e., volume) of the surface pits. FIGS. 2A-2J illustrate features of the additional embodiments in a schematic and simplified manner, and are not drawn to scale.

Figure 2A:
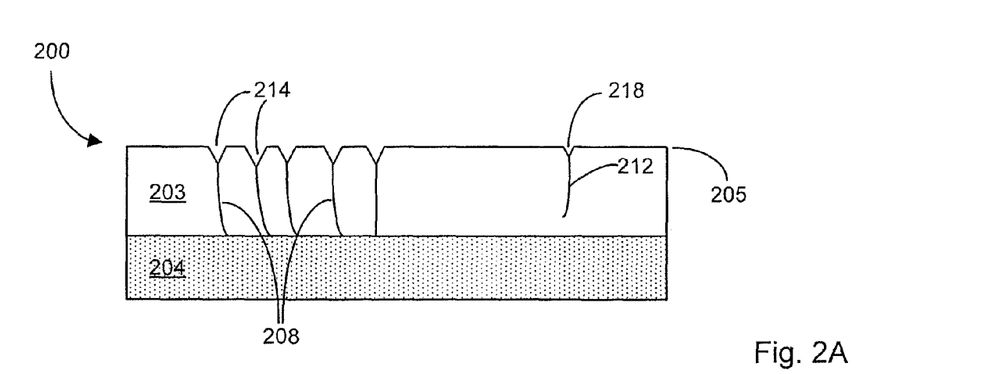
FIGS. 2A-2J schematically illustrates an additional embodiment of the invention.
Figure 2B:
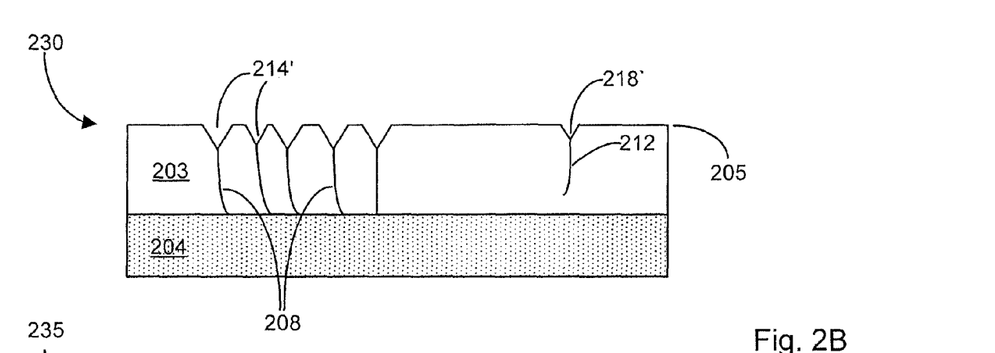

FIG. 2A schematically illustrates intermediate structure 200, which is similar to FIG. 1A. Intermediate structure 200 comprises base substrate 204, an initial semiconductor layer 203 (e.g., GaN) comprising an initial semiconductor surface 205. A number of dislocations 208 and 212 intersect the initial surface 205, resulting in associated surface pits 214 and 218 located at initial semiconductor surface 205. FIG. 2B schematically illustrates intermediate semiconductor structure 230 and is similar to FIG. 1B. Intermediate structure 230 may be formed by performing a selective decoration etch treatment to intermediate structure 200 to increase the size (i.e., the volume) of surface pits 214 and 218, resulting in enlarged surface pits 214' and 218' located at the initial semiconductor surface 205. The processes utilized to perform the decoration etch have been previously outlined and such process maybe likewise utilized in these embodiments of the invention.

Figure 2C:
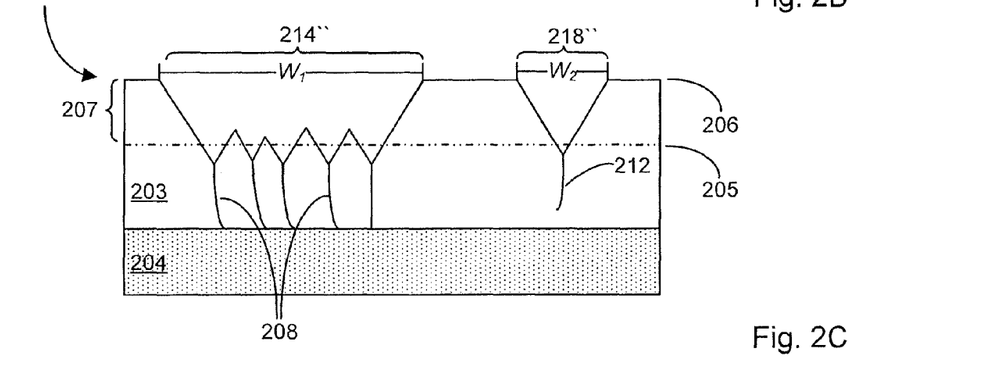

FIG. 2C illustrates intermediate structure 235 and demonstrates additional embodiments of the present invention that may be used not only for increasing the size of the individual surface pits, but for also encouraging individual surface pits to agglomerate. In other words, during growth, two or more surface pits may intersect one another to further increase the size of the surface pits. A semiconductor layer 207 (e.g., a III-nitride layer) may be epitaxially grown on initial semiconductor surface 205 of initial semiconductor layer 203. The semiconductor layer 207, in some embodiments, has crystal properties (e.g., lattice parameters and thermal expansion coefficients) that are substantially matched to those of initial semiconductor layer 203. The matching of crystal properties between semiconductor layer 207 and initial layer 203 may substantially preserve material quality. Since the initial layer 203 can comprise gallium nitride, semiconductor layer 207 will substantially preserve the crystal quality (e.g., the dislocation density) of the initial layer 203 if the semiconductor layer 207 also comprises gallium nitride or an alloy thereof.

Semiconductor layer 207, comprising primary surface 206, may be epitaxially grown by various methods including hydride (halide) vapor phase epitaxy (HYPE), metallorganic vapor phase epitaxy (MOVPE), and molecular beam epitaxy (MBE). The dislocation density at initial surface 205 and the growth conditions for semiconductor layer 207 can be selected in such a manner as to promote the formation and, further, the intersection of, interconnected surface pits (agglomerated or clustered surface pits) at primary semiconductor surface 206.

The density of dislocations at initial semiconductor surface 205, the growth time used to form (and, hence, the thickness of) semiconductor layer 207 can be selected so that the surface pits at primary semiconductor surface 206 have a size that facilitates the reliable and effective masking and overgrowth. In addition, the surface pits can be grown in such a way so as to include a plurality of dislocations at the base region or regions of the intersecting surface pits. For example, agglomerated surface pit structure 214" comprises five separate dislocations that extend to the base regions of the agglomerated surface pit structure 214".

Semiconductor layer 207 comprises primary surface 206, which is a substantially planar surface oriented at least substantially parallel to the underlying base substrate 204, and is composed of relatively high quality, substantially dislocation-free, semiconductor material, such as gallium nitride, interspersed with individual surface pits such as, for example, the illustrated surface pit 218", and with interconnected surface pits, such as, for example, the illustrated agglomerated surface pit 214". It has been found that suitably opened surface pits may be formed in a semiconductor layer having thicknesses between 0.1 μm and 1.0 μm.

In addition, in some embodiments, it may be advantageous to employ an initial layer 203, such as a III-nitride layer, which has a significant network of surface dislocations, thereby promoting the formation of surface pits and increasing the probability of surface pit intersection and agglomeration. Therefore, in some embodiments of the invention, initial semiconductor surface 205 may comprise a surface dislocation density of greater than $5\times10^8$ cm$^{-2}$, a surface dislocation density of greater than $1\times10^9$ cm$^{-2}$, or even more particularly, a dislocation density of greater than $1\times10^{10}$ cm$^{-2}$.

The formation of surface pits and the intersection of two or more surface pits formed in semiconductor layer 207 by the growth of semiconductor layer 207 may produce substantially discrete voids having a substantially uniform distribution throughout the semiconductor layer 207. As a result, the primary surface 206 may comprise a substantially uniform distribution of extended intersecting surface pits 214". The surface pits in the primary surface 206 may originate from a number, or at least substantially all, of the dislocations present at initial surface 205 of the initial layer 203. The dislocations present at initial surface 205 may have a substantially uniform distribution. Furthermore, the surface pits in the primary surface 206 may extend through all or a portion of semiconductor layer 207. For example, dislocations 208 and 212 form an agglomerated surface pit 214" and individual surface pit 218", respectively, in intermediate semiconductor layer 207, which extend entirely through semiconductor layer 207.

The surface pits, however, do not necessarily extend through the entirety of semiconductor layer 207. Some surface pits may extend through the entire semiconductor layer 207 whilst other surface pits may extend only through an upper portion of the semiconductor layer 207. Therefore, when it is stated that the surface pits originate at all or a number of the dislocations at initial surface 205 of the initial semiconductor layer 203, this is not to be interpreted as meaning that all of the surface pit actually originate at initial surface 205.

The surface pits may vary in width due to the nature of the dislocation (e.g., type, strain, Burgers vector, etc.). Additionally, the width of the surface pits may increase as the thickness of semiconductor layer 207 is increased.

As noted, the lateral extent of the surface pits can be further increased through the intersection of two or more surface pit structures. For example, the individual surface pit 218" associated with single dislocation 212 has an opening width $W_2$ in the primary surface 206. In comparison, surface pit agglomeration 214", which represents the intersection of five individual surface pits, has an opening width $W_1$ in primary surface 206, where $W_1$ is larger than $W_2$. The individual voided regions of the five surface pits of agglomeration 214" combine to form a significantly increased volume of void space, with the five individual dislocations located at the base of the combined void region.

The surface pits (individual and agglomerated) in semiconductor layer 207 may be produced in some embodiments by way of growth parameter selection. In some embodiments, a low temperature growth of semiconductor layer 207 is found to enhance the formation of surface pits. In this context, low temperature growth is defined as a growth temperature less than that commonly used for the deposition of high quality semiconductor material, which, for gallium nitride, is approximately 1000-1150° C. For example, the low temperature growth for formation of gallium nitride surface pits in accordance with embodiments of the present invention may be less than about 950° C., less than about 800° C., or even less than about 700° C. In other embodiments, the temperature of the growth may be maintained within ranges commonly used for high quality film growth (e.g., about 1000-1150° C. for gallium nitride), and the pressure of the growth reactor may be increased above those commonly utilized for high quality III-nitride deposition. For example, for gallium nitride films, the growth pressures in embodiments of the present invention may be greater than about 100 mbar, greater than about 200 mbar, or even greater than about 300 mbar. In other embodiments, the doping level of the III-nitride film may be varied to enhance the promotion of growth pits. For example, it has been observed in the art that pit density may decrease with Si doping in a III-nitride materials. The growth parameters for promoting the formation of surface pits may not be independent of one another, and growth conditions and parameters may by varied to enhance the formation of the surface pits.

The arrangement and density of the surface pits (both individual and agglomerated) should be such that, upon masking portions of the surface pits, sufficient surface area away from the masked surface pits (e.g., surface area that is at least significantly free of dislocations or defects in the crystal structure) remains for subsequent epitaxial nucleation and for support of the following epitaxial semiconductor layer. Generally, at least approximately 25% or more of the original area of the surface 205 may remain intact and free of surface pits. More particularly, at least approximately 50% or more of the original area of the surface 205 may remain intact and free of surface pits. Even more particularly, at least approximately 75% or more of the original area of the surface 205 may remain intact and free of surface pits.

Figures 2D, 2E:
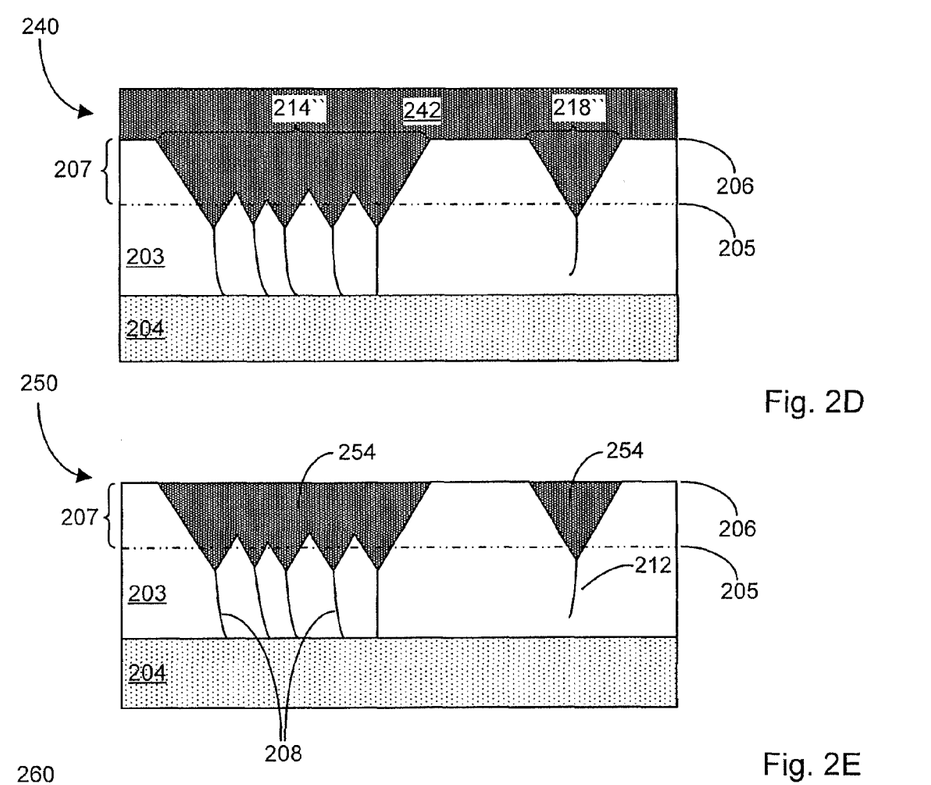

FIG. 2D illustrates intermediate semiconductor structure 240, which is similar to the intermediate semiconductor structure 140 of FIG. 1C. Intermediate semiconductor structure 240 illustrates the deposition of a first masking layer 242 on primary semiconductor surface 206 and within surface pits therein. First masking layer 242 masks and occludes both individual surface pit 218" and agglomerated surface pit 214". As in previous embodiments, the first masking layer 242 may comprise one or more amorphous materials such as silicon oxides, silicon nitrides, or mixtures thereof, and methods utilized for the formation of the first masking layer 242 may be similar to those previously outlined.

FIG. 2E illustrates intermediate semiconductor structure 250, which is similar to intermediate semiconductor structure 150 of FIG. 1D. Intermediate semiconductor structure 250 illustrates the removal of portions of the first masking layer 242, wherein portions of the first masking layer 242 that mask occlude the surface pits are substantially maintained within the surface pits, and those portions not masking the surface pits are substantially removed. The remaining portions of the first masking layer 242 located within the surface pits form a plurality of caps 254 (first masking structures), the caps 254 mask and, therefore, occlude associated dislocations 208 and 212. Methods for the selective removal of the first masking layer 242 (e.g., such as chemical mechanical polishing) have been previously outlined, and such methods can be utilized in these additional embodiments of the invention.

Figure 2F:
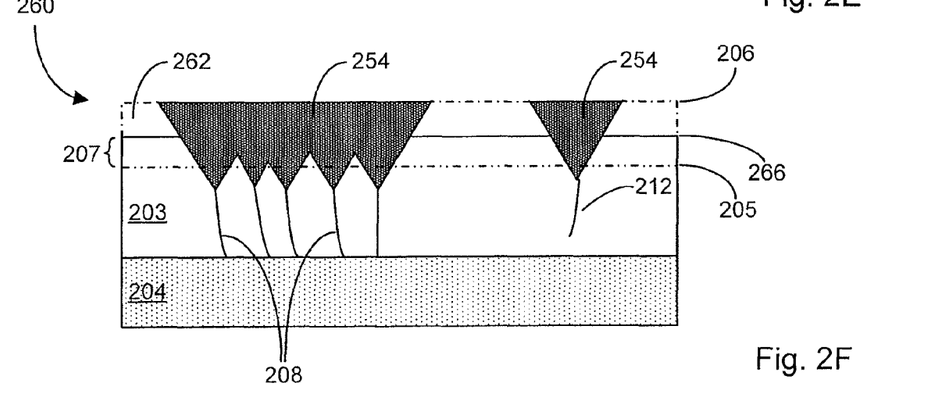

FIG. 2F illustrates intermediate semiconductor structure 260, which is similar to intermediate semiconductor structure 160 of FIG. 1E. Intermediate semiconductor structure 260 illustrates the removal of portions of semiconductor layer 207 whilst preserving the plurality of caps 254 within the surface pits. Phantom region 262 illustrates the portion of the semiconductor layer 207 that is removed to reveal secondary semiconductor surface 266. Methods for the selective removal of a portion of the semiconductor layer have been previously outlined and such methods can be employed in these additional embodiments of the invention.

Figure 2G:
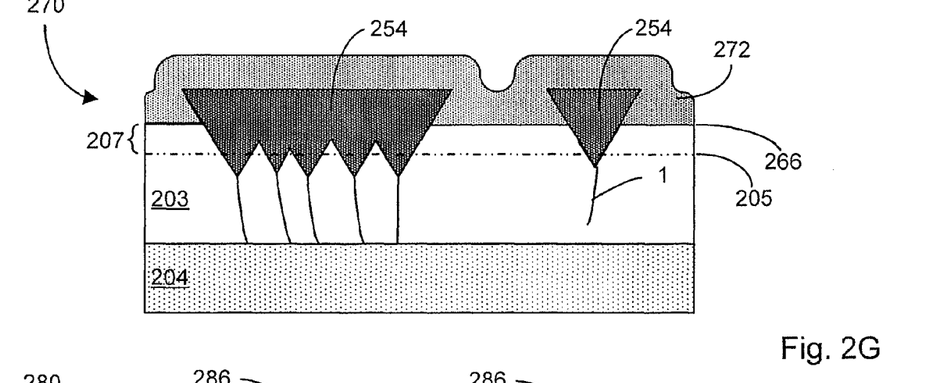

FIG. 2G illustrates intermediate semiconductor structure 270, which is similar to the intermediate semiconductor structure 170 of FIG. 1F. Intermediate semiconductor structure 270 illustrates the formation of the second masking layer 272 on intermediate semiconductor structure 260 (FIG. 2F). As previously outlined, the second masking layer 272 can be deposited in a substantially conformal manner and may comprise amorphous materials such as silicon oxide, silicon nitrides and mixtures thereof. In addition, methods previously outlined for forming a second masking layer can be utilized in these additional embodiments.

Figure 2H:
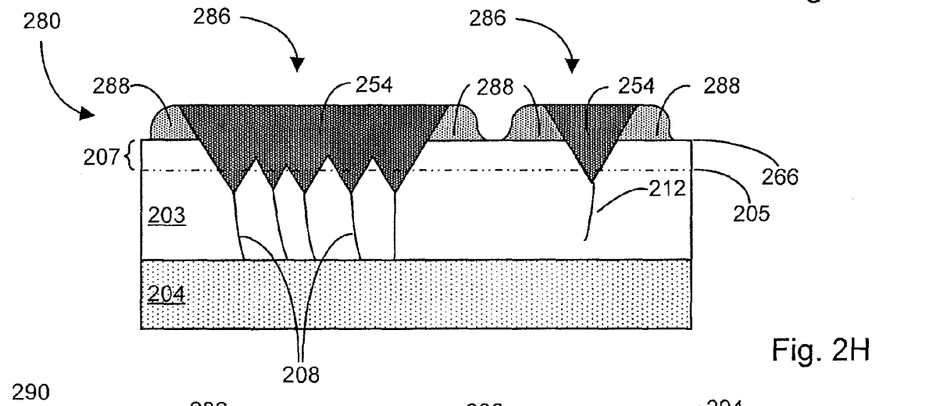

FIG. 2H illustrates intermediate semiconductor structure 280, which is similar to the intermediate structure 180 of FIG. 1G. Intermediate semiconductor structure 280 illustrates the removal of portions of the second masking layer 272 to form a plurality of spacer structures 288 (second masking structures), and also to reveal dislocation free portions of the secondary semiconductor surface 266. Spacer structures 288 may be formed by the anisotropic removal of portions of the second masking layer 272, as previously outlined. The formation of the plurality of spacer structures 288, adjacent to and encircling caps 154, produces a plurality of dislocation pit plugs 286 that may be capable of substantially preventing further propagation of associated dislocations 208 and 212 (or other defects).

Figure 2I:
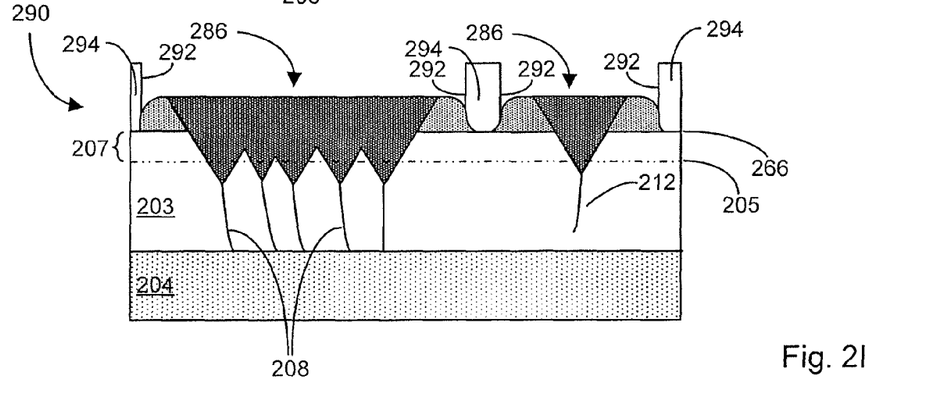

FIG. 2I illustrates intermediate semiconductor structure 290, which is similar to the intermediate structure 190 of FIG. 1H. Intermediate semiconductor structure 290 illustrates the initial stages of regrowth from the substantially dislocation free portions of secondary surface 266. Methods for producing the lateral growth over the plurality of dislocation pit plugs 286 have been previously outlined, and such methods can be utilized in these additional embodiments to produce growth areas 294 with side facets 292.

Figure 2J:
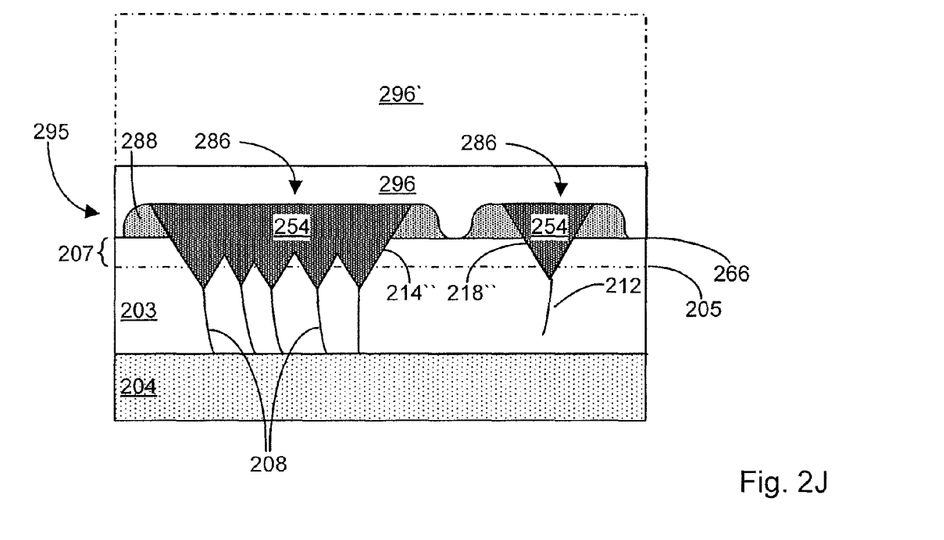

FIG. 2J illustrates intermediate semiconductor structure 295, which is similar to the intermediate semiconductor structure 195 of FIG. 1I. Intermediate semiconductor structure 295 illustrates the coalescence of the lateral growth material to form a substantially continuous following semiconductor layer 296. Following semiconductor layer 296 has a reduced surface dislocation density in comparison to the primary semiconductor surface 206 (e.g., of FIG. 2C) due to the formation of plurality of dislocation pit plugs 286, which may substantially prevent the propagation of dislocations 208 and 212 into following semiconductor layer 296. The thickness of the following semiconductor layer 296 can be increased to provide a desirable thickness of following semiconductor material 296', such methods having been previously outlined. The following semiconductor layer 296 as produced in the above embodiments may be utilized for the fabrication of devices and structures, as previously outlined.

Embodiments of the invention also include the intermediate and final semiconductor structures fabricated during embodiments of methods of the present invention as described herein.

The semiconductor structures may include a first semiconductor layer (102, 207) having an upper surface (166, 266) comprising a plurality of surface pits (114', 116', 118', 214", 218"), the pits intercepting one or more dislocations (108, 110, 112, 208, 212) in the interior of the first semiconductor layer. In further embodiments the structure may comprise two or more surface pits that have intercepted one another to form pit agglomeration regions (214").

The semiconductor structure may also comprise a plurality of first masking structures (154, 254) the first masking structures masking (or occluding) a plurality of the surface pits. The semiconductor structure may also comprise a plurality of second masking structures (i.e., spacers) (188, 288), the second masking structures being adjacent to and encircling the first masking structures (i.e., encircling the caps). The plurality of first masking structures have an upper surface which extends above the upper surface of the first semiconductor layer and the second masking structures extend laterally from the first masking structures. Both the first and second masking structures can comprise one or more amorphous materials from the group of silicon nitrides, silicon oxides, or mixtures thereof. The combination of the first and second masking structures forms a plurality of dislocation pit plugs (186, 286).

The semiconductor structure may further include a following semiconductor layer (196, 296) covering the plurality of dislocation plugs (186, 286), wherein the following semiconductor layer (196, 296) has a reduced density of surface dislocation in the comparison to the first semiconductor layer (102, 207).

The semiconductor structure, in some embodiments of the invention, can comprise III-nitride material, such as gallium nitride, indium nitride, aluminum nitride and alloys thereof.

Non-limiting examples are now described to illustrate further some embodiments of the invention. It should be understood that, in the following examples, process parameters (e.g., times, temperatures, etc.) are for illustrative purposes only, and do not limit embodiments of the present invention.

EXAMPLE

With reference to FIG. 2A, a (0001) oriented sapphire base substrate 204 is utilized. (Note that a number of process stages can be performed prior to growth, including a substrate cleaning cycle to remove unwanted contaminants (e.g., a high temperature bake in hydrogen), nitridization of the upper surface of the base substrate, or further surface pretreatments dependent on the chemistry of both the growth material and the base substrate.) A gallium nitride semiconductor layer 203 is grown on the sapphire base substrate. Growth commences with the deposition of a nucleation layer at a temperature of approximately 400°C.-500° C. for a period of 20 minutes. The temperature of the reactor is subsequently raised for thermal treatment of the nucleation layer and the growth of high quality gallium nitride. In this example, the temperature in the reactor is raised to a temperature of 1000°C.-1100° C. over a time period of 20 minutes, and growth was carried out for 90 minutes to produce a semiconductor layer thickness of approximately 1.0 µm-2.5 µm.

Semiconductor layer 203 is subsequently decorated to increase the size of the surface pits (i.e., to produce surface pits 214' and 218' of FIG. 2B). The defect selective etching process is now described in greater detail. Upon completion of the growth of gallium nitride layer 203, the gallium precursor source (e.g., trimethylgallium) is turned off and the temperature of the reactor is reduced. The temperature decrease in the reactor is of approximately 50° C./minute until a temperature of approximately 800°C.-900° C. is obtained and stabilized. A mixture of silane ($SiH_4$), ammonia ($NH_3$) and hydrogen ($H_2$) is introduced into the reaction chamber. In this example, the $SiH_4$ flow rate is approximately 3 sccm and the $NH_3/H_2$ flow (1:1) is 8 slm. In this particular example, the surface of the gallium nitride template is exposed to the etching environment for approximately 100-200 seconds.

The temperature of the reactor is then set to approximately 800°C.-900° C. for the growth of gallium nitride semiconductor layer 207. In this example, the reduced temperature growth was continued for 90 minutes until a layer thickness of approximately 500 nm is produced. A plurality of surface pits, both individual and agglomerated (218" and 214" respectively) are formed, as illustrated in FIG. 2C.

A first masking layer can be subsequently deposited (FIG. 2D). A silicon nitride layer can be deposited by CVD processes (e.g., from gaseous silane ($SiH_4$) and ammonia ($NH_3$) under conditions known in the art) to substantially cover the surface 206. CVD reactors for producing III-V nitride materials frequently employ $NH_3$ as a source for the precursor containing the Group V element. Therefore, for deposition of silicon nitride, the only requirement is the addition of a $SiH_4$ input to the reactor chamber, along with any additional auxiliary fixturing. Subsequently, portions of the first masking layer are removed (FIG. 2E) utilizing chemical mechanical polishing methods with appropriate slurry solutions to maintain the caps within the semiconductor structure.

Etching of the gallium nitride semiconductor is performed whilst substantially maintaining the caps within the surface pits (FIG. 2F). The gallium nitride is etched utilizing a reactive ion etching (RIE) (i.e., plasma) process. The RIE process utilizes a chlorine gas chemistry of $Cl_2+SiCl_4$. Such processes etch the gallium nitride whilst substantially preserving the cap structures.

Formation of the second masking structure (FIG. 2G) can be performed utilizing low-pressure chemical vapor deposition of silicon nitride at a temperature of approximately 700°C.-800° C. Subsequent process for anisotropically removing portions of the second masking structure (FIG. 2H) and forming spacer structures to fabricate dislocation plugs can be performed utilizing reactive ion etching. The gas chemistry, however, is altered from chlorine based gases to fluorine based gases such as $CF_4$, $SF_6$ and $CHF_3$.

Subsequent processes involve the formation of a following semiconductor layer (FIGS. 2I and 2J). Lateral growth of gallium nitride over the dislocation plugs can be performed by utilizing a reactor temperature of approximately 1050°C.-1100° C. at a pressure of approximately 100-400 Torr with a ratio of V/III precursors of between 3000 and 7000. Subsequent processes to thicken the following gallium nitride semiconductor layer to a desired thickness may utilize a more vertical growth mode. For example, growth may be carried out in a reactor with a reactor temperature of 850°C.-1000° C., at a pressure of 50-200 Ton and ratio of V/III precursors of 1000-2000.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims. Headings and legends are used herein for clarity and convenience only.

What is claimed is:

1. A method of forming a semiconductor structure, comprising:
   providing a semiconductor layer having a primary semiconductor surface comprising a plurality of surface pits associated with emergent dislocations;
   masking a plurality of the emergent dislocations with caps fabricated from a first masking layer, each cap extending at least partially into a surface pit of the plurality of surface pits;
   removing a portion of the semiconductor layer to form a secondary semiconductor surface;
   forming a plurality of spacer structures adjacent to the caps from a second masking layer, the caps and spacer structures together forming a plurality of dislocation pit plugs; and
   growing a following semiconductor layer from the secondary semiconductor surface over the plurality of dislocation pit plugs and producing a substantially continuous following semiconductor layer with fewer dislocations than the provided semiconductor layer.

2. The method of claim 1, wherein the plurality of surface pits of the primary semiconductor surface are produced by etching the primary semiconductor surface under etch conditions that encourage etching at or proximate to the emergent dislocations and that discourages etching away from the emergent dislocations.

3. The method of claim 1, wherein the plurality of surface pits of the primary semiconductor surface are produced by:
   etching an initial semiconductor surface under etch conditions that encourage etching at or proximate to the emergent dislocations and that discourages etching away from the emergent dislocations; and
   growing a semiconductor layer on the initial semiconductor surface under epitaxial growth conditions that are selected to encourage opening of the surface pits and the agglomeration of two or more surface pits at the primary surface.

4. The method of claim 1, wherein masking a plurality of the surface pits with caps further comprises:
   depositing one or more amorphous materials on the primary semiconductor surface; and
   removing portions of the amorphous materials deposited on the primary semiconductor surface which are not masking the surface pits.

5. The method of claim 4, wherein removing portions of the amorphous materials is performed by at least one of chemical mechanical polishing and plasma etching.

6. The method of claim 1, wherein removing a portion of the semiconductor layer is performed by plasma etching with chlorine-based etch chemistries.

7. The method of claim 1, wherein forming a plurality of spacer structures further comprises:
   depositing one or more substantially conformal amorphous materials; and
   anisotropically etching the one or more substantially conformal amorphous materials until the portions of the secondary semiconductor surface away from the dislocation pit plugs are exposed.

8. The method of claim 1, wherein the provided semiconductor layer and the following semiconductor layer each comprise III-nitride material.

9. The method of claim 1, wherein the first and second masking layers each comprise silicon oxides, silicon nitrides or a mixture thereof.

10. The method of claim 1, further comprising increasing a volume of at least one of the plurality of surface pits.

11. The method of claim 10, wherein increasing a volume of at least one of the plurality of surface pits comprises exposing the primary semiconductor surface to an etch chemistry comprising at least one of a halogen, potassium hydroxide, sodium hydroxide, and phosphoric acid.

12. The method of claim 1, wherein masking a plurality of the emergent dislocations with caps fabricated from a first masking layer comprises providing an initial masking material on the primary semiconductor surface and providing a subsequent material on the initial masking material.

13. The method of claim 1, wherein forming a plurality of spacer structures further comprises:
   depositing the second masking layer substantially conformally over the secondary semiconductor surface and the caps; and
   removing a portion of the second masking layer from the secondary semiconductor surface, leaving another portion of the second masking layer encircling the caps.

14. The method of claim 1, wherein growing a following semiconductor layer comprises growing the following semiconductor layer having a thickness less than approximately 1000 μm.

15. The method of claim 14, wherein growing a following semiconductor layer comprises growing the following semiconductor layer having a thickness less than approximately 100 μm.

16. The method of claim 15, wherein growing a following semiconductor layer comprises growing the following semiconductor layer having a thickness less than approximately 1 μm.

17. A method of forming a semiconductor structure, comprising:
   providing a first semiconductor layer comprising gallium nitride over a sapphire base substrate, the first semiconductor layer having a primary surface comprising a plurality of surface pits associated with emergent dislocations;
   masking a plurality of the emergent dislocations with caps fabricated from a first masking layer, each cap extending at least partially into a surface pit of the plurality of surface pits;
   removing a portion of the first semiconductor layer to form a secondary surface;
   forming a plurality of spacer structures adjacent to the caps from a second masking layer, the caps and spacer structures together forming a plurality of dislocation pit plugs; and
   growing a second semiconductor layer from the secondary surface over the plurality of dislocation pit plugs, second semiconductor layer comprising gallium nitride and having fewer dislocations than the first layer.

18. The method of claim 17, further comprising exposing the first semiconductor layer to a mixture of silane, ammonia, and hydrogen to increase a volume of at least one of the plurality of surface pits.

19. The method of claim 17, wherein masking a plurality of the emergent dislocations with caps fabricated from a first masking layer further comprises removing a portion of the first masking layer by chemical mechanical polishing.

20. The method of claim 17, wherein removing a portion of the first semiconductor layer to form a secondary surface comprises etching the first semiconductor layer by a reactive ion etching process utilizing a chlorine gas chemistry.

* * * * *